United States Patent [19]

Bory et al.

[11] Patent Number: 4,766,084

[45] Date of Patent: Aug. 23, 1988

[54] PROCESS FOR THE PRODUCTION OF AN ELECTRIC CONTACT ON A HGCDTE SUBSTRATE WITH A P CONDUCTIVITY AND APPLICATION TO THE PRODUCTION OF AN N/P DIODE

[75] Inventors: Cécile Bory, Saint Egreve; Jean-Louis O. Buffet, Seyssinet Pariset; Guy Parat, Grenoble, all of France

[73] Assignee: Commissariat a l'Energie Atomique, Paris, France

[21] Appl. No.: 97,616

[22] Filed: Sep. 16, 1987

[30] Foreign Application Priority Data

Sep. 19, 1986 [FR] France .................. 86 13141

[51] Int. Cl.[4] ............... H01L 31/18; H01L 21/44
[52] U.S. Cl. ........................... 437/3; 437/5; 437/185; 437/203; 437/229; 437/247; 437/904; 204/192.32; 204/192.34; 204/192.35; 156/643
[58] Field of Search ............... 437/3, 5, 22, 50, 185, 437/203, 228, 229, 235, 247, 904; 156/643; 204/192.32, 192.34, 192.35; 357/30 B, 30 Q, 65

[56] References Cited

U.S. PATENT DOCUMENTS

| | | |
|---|---|---|
| 3,988,774 | 10/1976 | Cohen-Solal et al. ........... 357/30 |
| 4,206,003 | 6/1980 | Koehler ........................ 437/5 |
| 4,290,884 | 9/1981 | Rotolante et al. .............. 156/630 |
| 4,301,591 | 11/1981 | Withers ........................ 437/3 |
| 4,310,583 | 1/1982 | Baker et al. .................. 428/209 |
| 4,318,217 | 3/1982 | Jenner et al. ................. 437/3 |
| 4,321,615 | 3/1982 | Blackman et al. .............. 357/30 |
| 4,411,732 | 10/1983 | Wotherspoon .................. 156/643 |
| 4,439,912 | 4/1984 | Pollard et al. ................ 437/3 |
| 4,447,275 | 5/1984 | Schulte ....................... 156/643 |
| 4,559,695 | 12/1985 | Baker ......................... 437/3 |
| 4,625,389 | 12/1986 | Readhead ...................... 437/3 |

FOREIGN PATENT DOCUMENTS

| | | |
|---|---|---|
| 0007668 | 2/1980 | European Pat. Off. . |
| 0062367 | 10/1982 | European Pat. Off. . |
| 59-74686 | 4/1984 | Japan ......................... 437/5 |
| 60-211884 | 10/1985 | Japan ......................... 437/3 |
| 61-03478 | 1/1986 | Japan ......................... 437/3 |
| 61-220440 | 9/1986 | Japan ......................... 437/3 |
| 2116363A | 9/1983 | United Kingdom ............... 437/3 |

OTHER PUBLICATIONS

Conference Europeenne sur les Communications Optiques (1982), pp. 389-393.

*Primary Examiner*—Aaron Weisstuch
*Attorney, Agent, or Firm*—Pearne, Gordon, McCoy & Granger

[57] ABSTRACT

The invention relates to a process for producing an electric contact on a HgCdTe substrate having a P conductivity and application to the production of an N/P diode. For producing an N/P diode, an insulating layer deposited on the HgCdTe substrate is etched by ion bombardment through a first mask, so as to produce a first opening in said insulating layer. The mask is removed and the substrate covered by the insulating layer undergoes a heat treatment, so as to at least mitigate the P conductivity drop induced by the ion bombardment in a first portion of the substrate facing the first opening. This is followed by ion implantation in a second portion of the substrate through a second mask in order to produce an N conductivity portion. This second mask is removed and the insulating layer is etched through a third mask by ion bombardment in order to produce a second opening facing the second portion. After removing the third mask, conductive pads are produced in the first and second openings.

14 Claims, 1 Drawing Sheet

PROCESS FOR THE PRODUCTION OF AN ELECTRIC CONTACT ON A HGCDTE SUBSTRATE WITH A P CONDUCTIVITY AND APPLICATION TO THE PRODUCTION OF AN N/P DIODE

BACKGROUND OF THE INVENTION

The present invention relates to a process for producing an electric contact on a HgCdTe substrate of P conductivity, as well as an application of said process to the production of an N/P diode.

The invention is applicable to all devices using a contact on a P conductivity, HgCdTe substrate and particularly infrared detectors using N/P photodiodes.

The invention more particularly relates to the production of contacts on a HgCdTe substrate epitaxied on an insulating support. Thus, in this configuration, the surface of the substrate on which the contacts can be produced is reduced to the front face of the substrate in a P conductivity region. Thus, the contacts are of small size and must be produced in accordance with microelectronics integration processes. However, the invention obviously applies to the production of contacts on solid HgCdTe substrates.

In known manner, in order to produce an electric contact on a substrate, an insulating layer is previously deposited on the face of the substrate where the contact is to be formed. This insulating layer is etched through a mask, e.g. of photosensitive resin, using a chemical solution so as to produce an opening over the entire thickness of the insulating layer. A conductive material is then deposited in the opening made in the insulating layer in order to produce an electric contact on the substrate.

With this process, the slope of the etching effected in the insulating layer is dependent on the texture and roughness of the material constituting the insulating layer, as well as the composition of the chemical solution. Therefore the slope of the opening made in the insulating layer is generally abrupt. Moreover, the conductive material deposited in said opening can discontinuously cover the wall of the opening and that part of the substrate facing the opening, thus forming an open circuit with the HgCdTe substrate.

The contact on the substrate is even more delicate when the insulating layer is constituted by two-layer structures, e.g. of the $SiO_2$—$Si_3N_4$, $SiO_2$—$ZnS$, or $CdTe$—$ZnS$ types. These pairs of materials do not have the same etching rate and consequently one of the materials used for producing the insulating substrate is subject to more marked etching than the other, which leads to an opening having a discontinuous slope.

The object of the invention is to obviate these disadvantages by carrying out etching by ion bombardment of the insulating layer. This ion bombardment makes it possible to etch the materials currently used for producing an insulating layer and also to control the slope of the opening made in said insulating layer.

However, when ion bombardment reaches a P conductivity, HgCdTe substrate, the conductivity of part of the substrate affected by said bombardment is subject to a reduction of its P conductivity and its conductivity can become N conductivity. The conductivity reversal of part of a P conductivity, HgCdTe substrate by ion bombardment is described in U.S. Pat. No. 4,411,732. This reversal leads to a production of a N/P junction, which is particularly sensitive to infrared radiation. Unfortunately, an electric contact produced on that part of the substrate affected by the ion bombardment is not of an ohmic nature and generates noise.

Thus, a further object of the invention is to bring the conductivity of that part of the substrate affected by the ion bombardment to at least its initial value and to produce an electric contact on said P part of the "cured" substrate, said contact having an ohmic nature and which generates less noise.

The invention also aims at applying the process for producing a contact on a P conductivity, HgCdTe substrate to the production of an N/P diode.

SUMMARY OF THE INVENTION

More specifically, the present invention relates to a process for the production of an electric contact on a HgCdTe substrate of P conductivity, wherein at least one insulating layer is deposited on said substrate, the entire thickness of the insulating layer is etched by ion bombardment so as to produce an opening in said insulating layer, the substrate covered by the insulating layer undergoes a heat treatment, so as to at least mitigate the P conductivity drop induced by the ion bombardment in that portion of the substrate facing the opening made in the insulating layer and a conductive pad is formed in the opening made in the insulating layer to form an electric contact with that part of the substrate facing the opening.

Etching by ion bombardment means both an etching by a planar-type plasma, assisted by ion bombardment and etching by reactive or non-reactive ion beams. Ion bombardment has an energy of approximately 50 to 1000 eV.

Etching the insulating layer by ion bombardment makes it possible to obtain an opening with a non-abrupt, linear slope over the entire thickness of the layer. Moreover, when the ion bombardment reaches that portion of the substrate facing the opening made in the insulating layer, there is a reduction in the P conductivity of that portion of the substrate. The depth of that portion of the substrate affected by ion bombardment is greater than the penetration depth of the ions and is dependent on the time during which the substrate has been bombarded. Thus, when a substrate is bombarded for two minutes, the depth of that portion of the substrate for which the P conductivity has decreased is approximately 15 $\mu$m.

The P conductivity of the substrate is due to a level or quantity of acceptors, or in other words mercury atom gaps or vacancies in the substrate, which exceeds the quantity or rate of residual donors, such as chemical impurities or defects inherent in the substrate. When the substrate is bombarded by ions, the P conductivity of that portion of the substrate affected by said bombardment decreases. Thus, ion bombardment produces crystal defects or imperfections, or in other words donors which are added to the residual donors and which accentuate the N character of that portion of the substrate affected by the bombardment.

Moreover, it would seem that this ion bombardment leads to a diffusion of mercury into said portion of the substrate leading to a reduction of the quantity of mercury atom gaps or vacancies in said part. When the quantity of acceptors present in that portion of the substrate affected exceeds the quantity of donors, the conductivity of said portion of the substrate remains of the P type. Conversely, when the quantity of acceptors is below the quantity of donors, the conductivity of the affected portion is of the N type.

The crystal defects produced by the ion bombardment start to disappear at a temperature of approximately 150° to 200° C. and the production of mercury atom gaps or vacancies requires a temperature above 200° C. for ensuring an adequate doping of at least approximately $10^{16}$ gaps or vacancies per $cm^3$. Moreover, to obtain in the affected portion at least the quantity of gaps or vacancies present prior to the ion bombardment, or in other words at least the same quantity of gaps or vacancies as in the remainder of the substrate, the heat treatment temperature must be of the same order of magnitude as that which has fixed the quantity of gaps or vacancies in the substrate.

Preferably, heat treatment is carried out at a temperature exceeding 200° C. and equal to the temperature for fixing the P conductivity of the substrate.

Advantageously, the substrate is annealed prior to the deposition of the insulating layer, in order to adjust the P conductivity of the substrate to a desired value, the heat treatment and annealing being carried out at the same temperature. The temperature used for fixing the quantity of gaps or vacancies in the substrate in this case corresponds to the annealing temperature.

Thus, by heating the substrate, it is possible to adjust the quantity of acceptors present therein to a level compatible e.g. with the operation of an N/P diode produced from said substrate. Moreover, to at least have the same quantity of acceptors in that portion of the substrate facing the opening made in the insulating layer prior to ion bombardment and after heat treatment, the heat treatment and annealing must be performed at the same temperature. However, the duration of the heat treatment is generally shorter than the annealing time.

The duration of said annealing is dependent on the desired quantity of acceptors in the substrate and the recombination rate or possibly the rate at which acceptors are produced. This time is e.g. approximately 10 to 100 hours. The duration of the heat treatment is particularly dependent on the rate at which the crystal defects produced by the ion bombardment are eliminated, as well as the desired quantity of acceptors, the latter being at least equal to that of the substrate. For example, the duration of said treatment is approximately 1 minute to 1 hour.

Obviously, in the case where the substrate used has initially had a quantity of acceptors of the same order of magnitude as that desired, said annealing is not carried out and the temperature of the heat treatment preferably exceeds 200° C. and is of the same order of magnitude as the temperature for producing the substrate then corresponding to the temperature which has fixed the P conductivity of the substrate.

According to a preferred embodiment of the process, the insulating layer is deposited in the form of a first and a second insulating layer.

Thus, the use as the insulating material of two insulating layers, such as e.g. of $SiO_2$ and $Si_3N_4$, or $SiO_2$ and ZnS or CdTe and ZnS makes it possible to improve the insulating properties of said material and possibly the anti-reflection properties, particularly in the case where the substrate is used for forming a photodiode illuminated from the insulating layer.

In order to control the slope of the etching carried out in the insulating substrate, when the latter is produced by ion bombardment through a resin mask deposited on said layer and having an opening facing the opening to be produced in said layer, it is advantageous to thermally treat said mask in order to make the resin flow in the mask opening prior to producing the insulating layer opening. This heat treatment is carried out at a temperature of approximately 130° C. and e.g. makes it possible to obtain a mask having an opening with a slope with respect to the normal to the surface of the insulating layer of approximately 30° to 40°.

The heat treatment making it possible to at least mitigate the P conductivity drop of that portion of the substrate facing the opening made in the insulating layer can be carried out according to different processes, more particularly making it possible to obviate any large exodiffusion of constituents of the substrate, such as mercury. For example, said heat treatment can be performed under a mercury atmosphere in a sealed flask or the like.

An insulating layer can also be deposited under vacuum on that part of the substrate facing the opening made in the insulating layer and said material is then eliminated after the heat treatment. In both cases, the quantity of acceptors is brought to the initial quantity by the heat treatment, i.e. to the quantity of acceptors present in the substrate.

It is also possible to deposit under vacuum a metallic material incorporating atoms with a P character on that portion facing the opening made in the insulating layer, so that after the heat treatment there is a P conductivity in said portion which exceeds that of the remainder of the substrate. It is easier to retain said material after the heat treatment.

The metallic material constitutes a reservoir of P character doping species, which diffuse into said substrate portion over a thickness of several microns, as a function of the duration of the heat treatment. For example, this material can be gold or copper and it is deposited in the form of a film generally having a thickness of several dozen nm. Thus, for example, in the case of gold, a heat treatment of approximately ten minutes at approximately 350° C. permits a diffusion of gold atoms over a thickness of approximately 10 $\mu m$.

In the case where the insulating material is deposited on that portion of the substrate facing the opening made in the insulating layer, said material is selectively removed with respect to the insulating layer and the substrate following heat treatment, e.g. by chemical etching. Thus, for example, in order to remove a $SiO_2$ material, it is possible to use a hydrofluoric acid solution, which leads to no deterioration of the HgCdTe or the insulating layer, e.g. of ZnS.

The invention also relates to a process for producing an N/P diode from a P conductivity, HgCdTe substrate, wherein, successively, at least one insulating layer is deposited on said substrate, the entire thickness of the insulating layer is etched by ion bombardment in order to produce a first opening in the insulating layer, a heat treatment is carried out on the substrate covered by the insulating layer, so as to at least mitigate the P conductivity drop induced by the ion bombardment in a first portion of the substrate facing the first opening, ion implantation takes place in the heat treated substrate through the insulating layer in order to form in said substrate a second portion of N conductivity spaced from the first part, the entire thickness of the insulating layer is etched by ion bombardment, so as to produce a second opening in the insulating layer facing the second portion and conductive pads are formed in the first and second openings of the insulating layer, in order to produce an electric contact with each of said first and second portions of the substrate facing said openings.

This process for the production of an N/P diode is an application of the process for producing an electric contact on a P conductivity, HgCdTe substrate described hereinbefore and consequently has the same characteristics as the latter. The insulating layer can in particular be constituted by several stacked layers.

The second portion with N conductivity results from crystal defects produced by ion implantation, which takes place at energy levels of approximately 50 to 200 keV. Moreover, the defects produced by ion implantation start to be healed or cured as from 150° C., so that the heat treatment of the N/P diode production process is necessarily performed prior to the creation of said second portion.

Advantageously, there is also an annealing of the substrate prior to depositing the insulating layer in order to adjust the P conductivity of the substrate to a desired value, the heat treatment and annealing being performed at the same temperature.

Moreover, the heat treatment is preferably performed at a temperature exceeding 200° C. and equal to the temperature which has fixed the P conductivity of the substrate, i.e. at the annealing temperature in the case where an annealing is carried out and the substrate production temperature in the opposite case.

This heat treatment is preferably carried out following the vacuum deposition on the first portion of the substrate facing the first opening made in the insulating layer of a metallic material incorporating atoms with a P character, in order to obtain a P conductivity in said portion of the substrate exceeding that of the remainder of the substrate, said material preferably being retained after said heat treatment.

Preferably, the first opening of the insulating layer is obtained by ion bombardment through a resin mask deposited on said layer and having an opening facing the first opening to be produced in said layer, the mask then undergoing heat treatment to make the resin flow into the opening of the mask prior to producing said first opening.

In the same way, the second opening of the insulating layer is produced by ion bombardment through a resin mask deposited on the layer having an opening facing the second opening to be produced in said layer and the mask advantageously undergoes a heat treatment to make the resin flow into the opening of the mask before making said second opening.

BRIEF DESCRIPTION OF THE DRAWINGS

The invention is described in greater detail hereinafter relative to non-limitative embodiments and the attached drawings, wherein.

DETAILED DESCRIPTION OF THE PREFERRED EMBODIMENTS

FIG. 1 shows a P conductivity, HgCdTe substrate 1 epitaxied on an insulating support 5, such as a CdTe support. On the upper face of the substrate, i.e. on that face thereof opposite to that facing the insulating support, is deposited an insulating layer 3, e.g. of $SiO_2$, or ZnS, or $Si_3N_4$ possibly acting as an antireflection coating. Said insulating layer is e.g. deposited by atomization or sputtering over a thickness of approximately 100 to 1000 nm.

Prior to the deposition of layer 3, substrate 1 has preferably undergone annealing so as to adjust the quantity or level of acceptors, or in other words gaps or vacancies in the substrate, to a desired value compatible with the operation of an N/P diode produced from said substrate. This value is generally approximately $10^{16}$ to $10^{17}$ gaps or vacancies per $cm^3$. Annealing at 350° C. leads to approximately $8 \times 10^{16}$ acceptors or gaps or vacancies/$cm^3$.

Figure 1A:
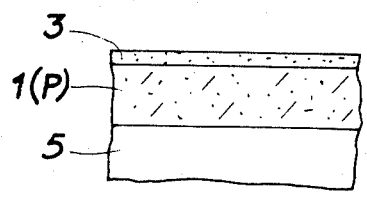
FIGS. 1a-1i diagrammatically show the main stages of producing an N/P diode with a contact on a substrate of P conductivity according to the invention.
Figure 1B:
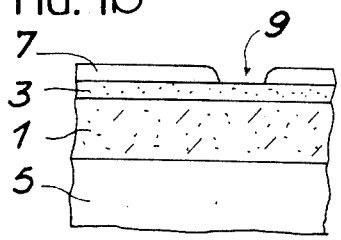
Figure 1C:
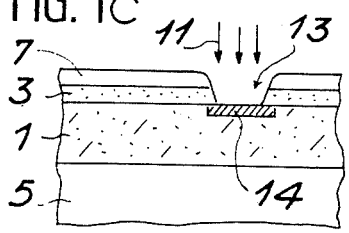

This is followed by the deposition on insulating layer 3 of a photosensitive resin layer, which is irradiated and developed so as to produce in said layer an opening 9, e.g. of approximately 4 to 10 $\mu$m, facing that portion of the insulating layer 3 which is to be etched (FIG. 1b).

In order that the thus produced mask 7 has an opening 9 with an inclined wall, it undergoes heat treatment. The heated resin flows along the wall of opening 9, which has a slope inclined with respect to the normal by an angle of 30° to 40° (FIG. 1b). For example, for the resin marketed under the name SHIPLEY 1350H, said heat treatment is performed at a temperature of approximately 130° C. for approximately 1 minute.

Once this stage has been carried out, the entire thickness of insulating layer 3 is etched in order to form an opening 13 by ion bombardment 11 (FIG. 1c), e.g. an ionic machining device, such as that marketed under the name MICROETCH by Veeco Instruments. The ions used are argon ions or ions of a $Ar + O_2$ mixture (the latter being in particular used for producing sloping contacts) and the energy levels of the ion beam vary from 100 eV to 1 keV. The current and energy values used with such a device are e.g. 500 nA/$cm^2$ and 500 eV.

Under these conditions, the etching of layer 3 performed through mask 7, in which the slope of opening 9 is 30° to 40°, leads to an opening 13 with a slope of approximately 50° to 60° relative to the normal to said layer. Mask 7 is removed by conventional procedures after producing the opening 13, which will subsequently constitute an electric contact hole.

That portion 14 of the substrate facing the insulating layer opening 13 affected by said ion bombardment is subject to a P conductivity reduction, more particularly due to the crystal defects produced by ion bombardment. The depth of said portion 14 is e.g. approximately 1 $\mu$m. When the quantity of acceptors present after said ion bombardment in portion 14 is below the quantity of donors, the conductivity of portion 14 is of the N type, as stated hereinbefore.

In order to at least mitigate the drop of the P conductivity induced by ion bombardment, the insulating layer-covered substrate then undergoes a heat treatment. The temperature of said heat treatment preferably exceeds 200° C., in order to eliminate all the crystal defects produced by the ion bombardment in portion 14 and to produce gaps or vacancies when said ion bombardment has led to a diffusion of mercury, or in other words a drop in acceptor quantity in said portion 14. Moreover, said temperature is equal to the temperature which made it possible to adjust the initial value of the quantity of acceptors present in the substrate to have at least the same quantity of acceptors in portion 14 and is equal to 350° C. The quantity of the remaining donors after said treatment is again constituted by the residual donors.

Figure 1D:
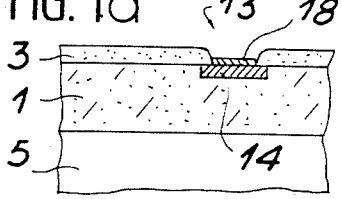

This heat treatment is e.g. performed after the vacuum deposition of a material 18 on substrate portion 14 and in the opening 13 made in insulating layer 3, as illustrated in FIG. 1d. Material 18 can be constituted by a metallic material, such as gold, copper or any other metal with P character doping species or an insulating material, such as $SiO_2$. It is deposited in the form of a film, e.g. having a thickness of several dozen nm.

When material 18 is of an insulating nature, the heat treatment of the substrate covered with said material makes it possible to prevent an exodiffusion of mercury, eliminate crystal defects due to ion bombardment and produce possible gaps or vacancies in order to bring the conductivity of portion 14 to the conductivity of the remainder of the substrate. The same result can be obtained by performing the heat treatment under a mercury atmosphere.

When material 18 is of a metallic nature, the heat treatment performed with said metallic material, apart from the aforementioned properties, makes it possible to diffuse a P character doping species over a depth of several micrometers as a function of the treatment period, thus leading to an over doped portion 14, i.e. whose acceptor level exceeds that of the remainder of the substrate. The depth of this overdoped portion is e.g. between 1 and 5 $\mu m$.

Following heat treatment, when material 18 is of an insulating nature, it is selectively eliminated with respect to substrate 1 and insulating layer 3, e.g. by chemical etching. In the case where the insulating layer 3 is of ZnS, material 18 is e.g. eliminated by a hydrofluoric acid solution when it is formed by $SiO_2$. However, after said heat treatment, when the material 18 is of a metallic nature, it is preferably retained.

Advantageously use is made of a metallic material 18 for producing a N/P diode. Thus, material 18 has been used in the remainder of the drawings, because it is considered to be of a metallic nature.

To produce an N/P diode, it is necessary to carry out an ion implantation in portion 22 of the P substrate spaced from portion 14 (FIG. 1f), which makes it possible to obtain N conductivity in said portion 22 and again etch the insulating layer 3 to form a contact on portion 22.

Figure 1E:
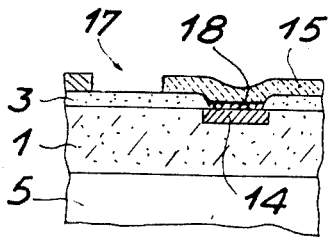

Thus, as illustrated in FIG. 1e, on insulating layer 3 is firstly deposited a second mask 15, such as a photosensitive resin layer, which is irradiated and developed so as to obtain an opening 17, e.g. of approximately 10 to 100 $\mu m$ in said resin and located outside substrate portion 14.

Figure 1F:
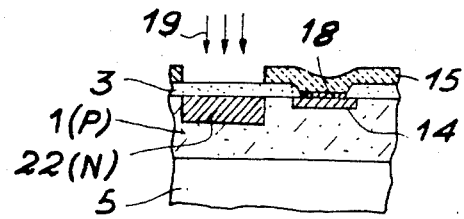

The thus produced mask 15 makes it possible to carry out through the layer 3 an ion implantation 19 in that portion 22 of substrate 1 which faces opening 17, so as to obtain an N conductivity portion 22 (FIG. 1f). The quantity of donors then present in portion 22 exceeds the quantity of residual donors and the quantity of acceptors in the substrate. The depth of portion 22 is chosen e.g. as approximately 5 $\mu m$.

The implanted ions are light ions, such as ions of boron or phosphorus, the implantation doses varying from $10^{13}$ to $10^{16}$ ions/$cm^2$ and the implantation energies vary between 50 and 200 keV.

Figure 1G:
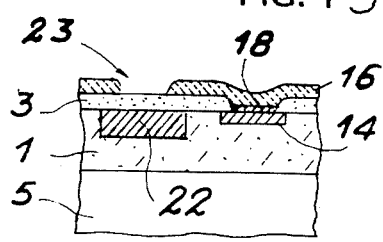

Following this stage, the implantation mask 15 is removed by conventional methods and on the insulating layer 3 is formed a third mask 16, such as a photosensitive resin layer, which is irradiated and developed so as to obtain an opening 23, e.g. of approximately 4 to 10 $\mu m$ in the said resin layer. Opening 23, which is smaller than that of mask 15, faces substrate portion 22 (FIG. 1g). Mask 15 represents the image of the contact hole to be formed in insulating layer 3 facing portion 22. It fixes the dimensions and location of said contact hole.

In the same way as for mask 7, a heat treatment of mask 16 can also be carried out in order to make the resin flow into the opening 23 of mask 16, so as to obtain an opening 23 which slopes with respect to the normal by an angle of approximately 30° to 40°.

Figure 1H:
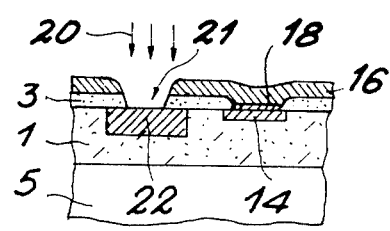
Figure 1I:
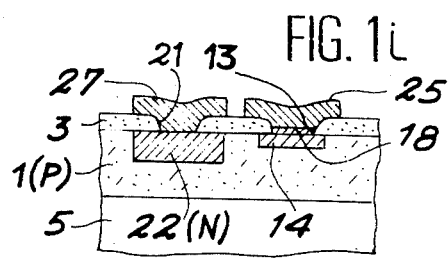

The following stage consists of opening the part of the insulating layer 3 present between portion 22 and opening 23 of mask 16. Etching is carried out through mask 16 by ion bombardment 20 and without conductivity reversal for portion 22, due to the fact that said portion already has N conductivity (FIG. 1h). Thus, a contact hole 21 is formed in the insulating layer, which has a slope inclined by 50° to 60° relative to the normal, if etching is carried out under the same conditions as the previously described etching of opening 13. The formation of opening 21 is followed by the removal of mask 16 using conventional procedures.

The final stage of producing the N/P diode (FIG. 1i) consists of forming two conductive pads 25,27, respectively in the openings 13 and 21 of insulating layer 3, in order to produce electric contacts to portions 14 and 22 of substrate 1 respectively having P and N conductivities. For this purpose, on the entire insulating layer 3 is deposited by cathodic sputtering a continuous conductive layer e.g. constituted by two stacked layers respectively of Cr and Au, followed by the etching of said layer to obtain two conductive pads respectively in openings 13 and 21 providing two contacts respectively to portions 14 and 22 of the substrate, said two contacts being insulated from one another.

Obviously, when material 18 is of a metallic nature and is retained, it is inserted between the pad 25 and the surface of portion 14. In this case, the contact with portion 14 is constituted by material 18 and pad 25. However, when material 18 is eliminated, only pad 25 forms the contact with portion 14.

Figure 2:
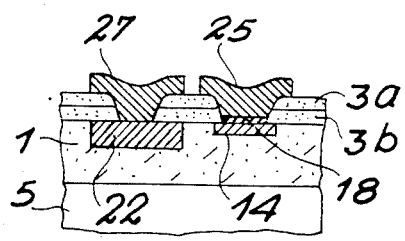
FIG. 2 diagrammatically show another example of an N/P diode obtained according to the production process of the invention and having two insulating layers.

FIG. 2 shows a variant of an N/P diode produced by the production process according to the invention. This diode differs from that shown in FIG. 1i by an insulating layer 3 constituted by the superimposing of two insulating layers 3a and 3b, e.g. of $SiO_2$ and $Si_3N_4$, or $SiO_2$ and ZnS or CdTe and ZnS. The different stages of producing this diode are the same as those described hereinbefore. The two insulating layers give a better electrical insulation, as well as anti-reflection properties, which is of interest in infrared detection.

In the drawings it has been decided to represent a HgCdTe substrate epitaxied on an insulating material for producing contacts on the front face of the substrate, but this is obviously of a non-limitative nature. It is also possible to produce contacts on a solid substrate using the same production stages. Moreover, the drawings show the production of a N/P diode, but obviously the process for producing a contact on a P conductivity, HgCdTe substrate can apply to other devices and in particular to those having N-type regions produced by ion implantation.

What is claimed is:

1. A process for the production of an electric contact on a HgCdTe substrate of P conductivity, wherein at least one insulating layer is deposited on said substrate, the entire thickness of the insulating layer is etched by ion bombardment so as to produce an opening in said insulating layer, the substrate covered by the insulating layer undergoes a heat treatment, so as to at least mitigate the P conductivity drop induced by the ion bombardment in that portion of the substrate facing the opening made in the insulating layer, and a conductive pad is formed in the opening made in the insulating layer to form an electric contact with that portion of the substrate facing the opening.

2. A process according to claim 1, wherein the substrate undergoes annealing prior to the deposition of the insulating layer, in order to adjust the P conductivity of the substrate to a desired values, the heat treatment and annealing being performed at the same temperature.

3. A process according to claim 1, wherein first and second insulating layers are deposited on the substrate.

4. A process according to claim 1, wherein the opening in the insulating layer is produced by ion bombardment through a resin mask deposited on the said layer and having an opening facing the opening to be produced in said layer, and the mask is thermally treated in order to make the resin flow into the opening of said mask before making the opening in the insulating layer.

5. A process according to claim 1, wherein the heat treatment is performed under a mercury atmosphere.

6. A process according to claim 1, wherein the heat treatment is performed following the vacuum deposition on that portion of the substrate facing the opening made in the insulating layer of an insulating material, the latter being eliminated after said heat treatment.

7. A process according to claim 1, wherein the heat treatment is carried out following the vacuum deposition on that portion of the substrate facing the opening made in the insulating layer of a metallic material incorporating atoms having a P character, in order to obtain a P conductivity in said substrate portion which exceeds that of the remainder of the substrate.

8. A process according to claim 1, wherein the heat treatment is performed at a temperature exceeding 200° C. and equal to the annealing temperature which has previously fixed the P conductivity of the substrate.

9. A process for producing an N/P diode from a P conductivity, HgCdTe substrate, wherein, successively, at least one insulating layer is deposited on said substrate, the entire thickness of the insulating layer is etched by ion bombardment in order to produce a first opening in the insulating layer, a heat treatment is carried out on the substrate covered by the insulating layer, so as to at least mitigate the P conductivity drop induced by the ion bombardment in a first portion of the substrate facing the first opening, ion implantation takes place in the heat treated substrate through the insulating layer in order to form in said substrate a second portion of N conductivity spaced from the first part, the entire thickness of the insulating layer is etched by ion bombardment, so as to produce a second opening in the insulating layer facing the second portion and conductive pads are formed in the first and second openings of the insulating layer, in order to produce an electric contact with each of said first and second portions of the substrate facing said openings.

10. A process according to claim 9, wherein the substrate is annealed prior to the deposition of the insulating layer, in order to adjust the P conductivity of the substrate to a desired value, the heat treatment and annealing being performed at the same temperature.

11. A process according to claim 9, wherein the heat treatment is performed following the vacuum deposition on the first part of the substrate facing the first opening made in the insulating layer of a metallic material having atoms with a P character, in order to obtain a P conductivity in said first part of the substrate exceeding that of the remainder of the substrate.

12. A process according to claim 9, wherein the heat treatment is performed at a temperature exceeding 200° C. and equal to the annealing temperature which has previously fixed the P conductivity of the substrate.

13. A process according to claim 9, wherein the first opening of the insulating layer is produced by ion bombardment through a resin mask deposited on said insulating layer and having an opening facing the first opening to be produced in said layer, and said mask is thermally treated in order to cause a flow of resin into the opening of said mask prior to the production of said first opening.

14. A process according to claim 9, wherein the second opening of the insulating layer is produced by ion bombardment through a resin mask deposited on said insulating layer and having an opening facing the second opening to be produced on the said layer, so that said mask undergoes a heat treatment in order to make the resin flow into the opening of the mask before producing the second opening.

* * * * *